United States Patent
Kim et al.

(10) Patent No.: US 10,689,749 B2
(45) Date of Patent: Jun. 23, 2020

(54) LINEAR EVAPORATION SOURCE AND VACUUM DEPOSITION APPARATUS INCLUDING THE SAME

(71) Applicant: Samsung Display Co., Ltd., Yongin, Gyeonggi-do (KR)

(72) Inventors: Min Ho Kim, Yongin (KR); Seong Ho Jeong, Yongin (KR); Hyun Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 755 days.

(21) Appl. No.: 13/797,632

(22) Filed: Mar. 12, 2013

(65) Prior Publication Data

US 2014/0109829 A1  Apr. 24, 2014

(30) Foreign Application Priority Data

Oct. 22, 2012  (KR) .......................... 10-2012-0117356

(51) Int. Cl.
   *C23C 14/24* (2006.01)
   *C23C 14/26* (2006.01)

(52) U.S. Cl.
   CPC ............. *C23C 14/243* (2013.01); *C23C 14/26* (2013.01)

(58) Field of Classification Search
   CPC ............. C23C 14/24–325; C23C 15/46; C23C 15/481–483; C23C 14/545;
   (Continued)

(56) References Cited

U.S. PATENT DOCUMENTS 3,770,047 A * 11/1973 Kirkpatrick .......... B22D 27/045
                                                            164/122.1
5,116,456 A *  5/1992 Nestor .................... C30B 11/00
                                                            117/223
(Continued)

FOREIGN PATENT DOCUMENTS

CN       101319302 A       12/2008
CN       101445908 A        6/2009
(Continued)

OTHER PUBLICATIONS

Chinese Office Action dated Jan. 22, 2017 for Chinese Patent Application No. CN 201310067210.8, which shares priority of Korean Patent Application No. KR 10-2012-0117356.

*Primary Examiner* — Benjamin Kendall
(74) *Attorney, Agent, or Firm* — Lewis Roca Rothgerber Christie LLP (57) ABSTRACT

A linear evaporation source is disclosed. In one aspect, the source includes a crucible storing an evaporated material, a heater unit surrounding the crucible and heating the crucible, and a plurality of lateral reflectors surrounding a lateral surface of the heater unit. Each of the lateral reflectors includes a first reflector combined with the heater unit while being spaced apart from the heater unit and having a plurality of first openings and a second reflector movably combined with the first reflector and having a second opening. Open ratios of the lateral reflectors are independently adjusted to control a temperature of the crucible according to areas of the crucible. Thus, deposition uniformity of the linear evaporation source is enhanced.

12 Claims, 6 Drawing Sheets

(58) Field of Classification Search
CPC .............. C23C 16/4485; C23C 14/541; H01L
21/67098–67115; Y10T 117/1068; Y10T
117/1004; Y10T 117/1008; B01L 1/025;
C12M 41/14; C30B 15/02; C30B 15/14;
C30B 15/22; C30B 23/066; C30B 29/06
USPC ........................................................ 165/59
See application file for complete search history.

(56) References Cited

U.S. PATENT DOCUMENTS

| | | | |
|---|---|---|---|
| 5,162,072 A * | 11/1992 | Azad ...................... | C30B 15/14 117/14 |
| 7,905,961 B2 | 3/2011 | Jeong et al. | |
| 8,845,807 B2 | 9/2014 | Seo et al. | |
| 2003/0131789 A1 * | 7/2003 | Amemiya ............... | C30B 11/00 117/200 |
| 2007/0077357 A1 | 4/2007 | Jeong et al. | |
| 2007/0092635 A1 * | 4/2007 | Huh ........................ | C23C 14/12 427/64 |
| 2009/0288591 A1 * | 11/2009 | Ravi ....................... | C30B 15/02 117/13 |
| 2010/0218723 A1 * | 9/2010 | Yamamoto et al. ......... | 118/724 |
| 2011/0097787 A1 * | 4/2011 | Yamashita .................. | 435/283.1 |
| 2011/0146579 A1 * | 6/2011 | Seo et al. ....................... | 118/726 |

FOREIGN PATENT DOCUMENTS

| | | |
|---|---|---|
| CN | 102046771 A | 5/2011 |
| JP | 2008-115416 A | 5/2008 |
| JP | 2008115416 A * | 5/2008 |
| KR | 10-0645689 B1 | 11/2006 |
| KR | 10-2007-0084757 A | 8/2007 |
| KR | 10-2007-0094412 A | 9/2007 |
| KR | 10-2011-0010572 A | 2/2011 |
| KR | 10-1094299 B1 | 12/2011 |
| KR | 10-2012-0059014 A | 6/2012 |
| TW | 201241207 A1 | 10/2012 |

* cited by examiner

LINEAR EVAPORATION SOURCE AND VACUUM DEPOSITION APPARATUS INCLUDING THE SAME

CROSS-REFERENCE TO RELATED APPLICATIONS

This US non-provisional patent application claims priority under 35 USC § 119 to Korean Patent Application No. 10-2012-0117356, filed on Oct. 22, 2012, the entirety of which is hereby incorporated by reference.

BACKGROUND

The described technology generally relates to linear evaporation sources and vacuum deposition apparatuses including the same and, more particularly, to a linear evaporation source capable of controlling the temperature of a crucible according to areas and a vacuum deposition apparatus including the linear evaporation source.

In general, a thin film is formed on a substrate by means of physical vapor deposition (PVD) such as vacuum deposition, ion plating, and sputtering or chemical vapor deposition (CVD) using gas reaction.

SUMMARY

One inventive aspect is a linear evaporation source that may include a crucible storing an evaporated material, a heater unit surrounding the crucible and heating the crucible, and a plurality of lateral reflectors surrounding a lateral surface of the heater unit. Each of the lateral reflectors may include a first reflector combined with the heater unit while being spaced apart from the heater unit and having a plurality of first openings and a second reflector movably combined with the first reflector and having a second opening.

In an embodiment, open ratios of the lateral reflectors may be independently adjusted.

In an embodiment, each of the lateral reflectors may further include a transfer unit transferring the second reflector in a first direction.

In an embodiment, the first opening and the second opening may have the same size and number.

In an embodiment, the heater unit may include a heater heating the crucible and a heater frame supporting the heater.

In an embodiment, the linear evaporation source may further include a temperature sensing unit fixed to the heater frame and disposed between the crucible and the heater. The temperature sensing unit may be provided in the same number as the lateral reflectors.

Another aspect is a vacuum deposition apparatus that may include a process chamber, a linear evaporation source, and a substrate holder. The substrate holder may be disposed opposite to the linear evaporation source.

In an embodiment, the linear evaporation source may be disposed inside the process chamber.

DETAILED DESCRIPTION

Generally, a vacuum deposition apparatus for performing vacuum evaporation includes a crucible for storing an evaporated material, a heater for heating the crucible, and an evaporation source including a reflector for blocking loss of heat generated by the heater. A linear evaporation source, which is elongated in one side direction, may be used as the evaporation source.

However, in case of the linear evaporation source, a small temperature difference is produced at both the ends in the one side direction of the crucible. Thus, a thin film of uniform thickness cannot be formed.

Embodiments will be described with reference to the accompanying drawings. It should be noted, however, that the inventive concept is not limited to the following embodiments, and may be implemented in various forms.

Figure 1:
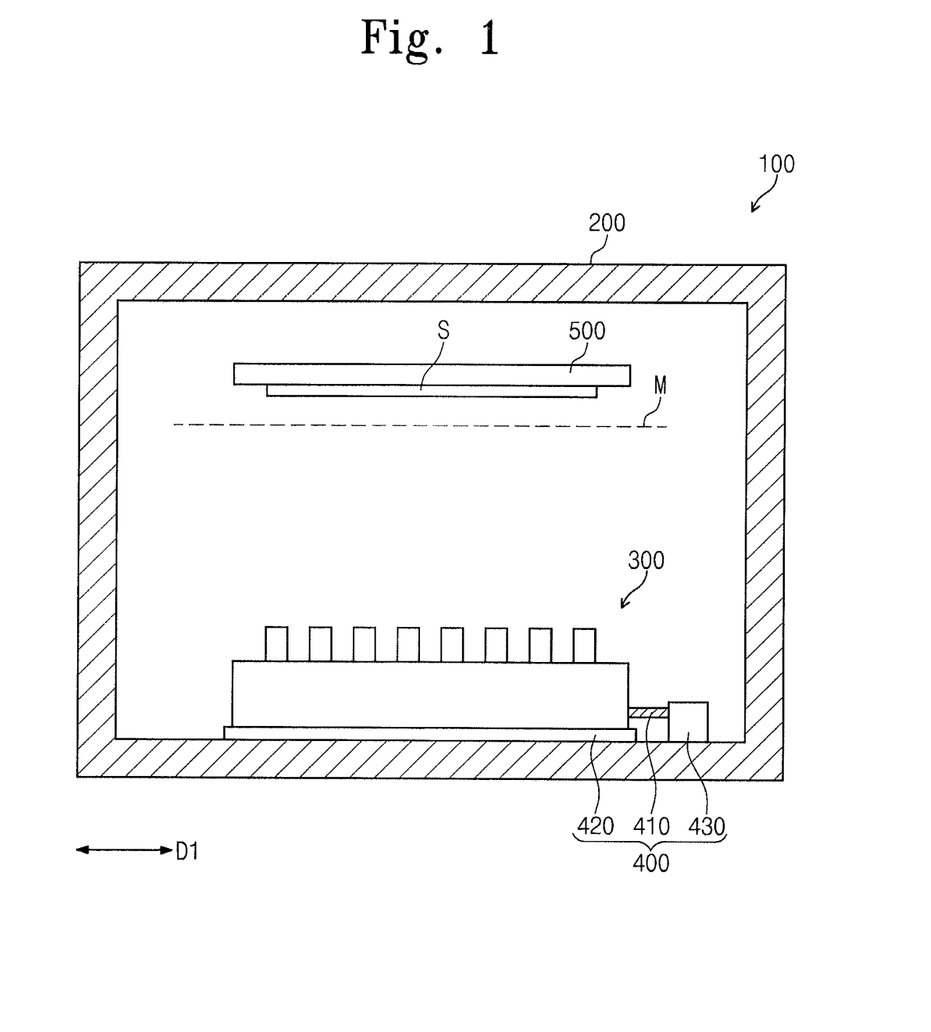
FIG. 1 is a schematic diagram of a vacuum deposition apparatus according to an embodiment.

FIG. 1 is a schematic diagram of a vacuum deposition apparatus 100 according to an embodiment. The vacuum deposition apparatus 100 includes a process chamber 200, a linear evaporation source 300 disposed inside the process chamber 200, and a substrate holder 500 disposed opposite to the linear evaporation source 300.

The process chamber 200 provides a space for performing a deposition process. The process chamber 200 may further include a carry-in-and-out entrance (not shown) for carrying in and output a substrate S and an exhaust terminal (not shown) connected to a vacuum pump (not shown) for exhausting an evaporated material that is not deposited on the substrate S. The process chamber 200 is disposed between the linear evaporation source 300 and the substrate holder 500 such that the evaporated material is deposited on the substrate S in a consistent pattern. The process chamber 200 may further include a mask assembly M having a plurality of slits.

The substrate holder 500 is adapted to mount a substrate S carried into the process chamber 200 and may further include a separate fixing member (not shown) for fixing the substrate S during the deposition process.

As shown in FIG. 1, the linear evaporation source 300 of the vacuum deposition apparatus 100 is disposed at a lower portion of the process chamber 200 and the substrate holder 500 thereof is disposed at an upper portion of the chamber process chamber 200 such that the substrate S is fixed be substantially horizontal to the ground by the substrate holder 500. However, the linear evaporation source 300 may be disposed at one lateral surface of the process chamber 200 and the substrate holder 500 may be disposed at the other lateral surface of the process chamber 200 such that the substrate S fixed to the substrate holder 500 has an angle of about 70 to about 110 degrees to the ground to prevent substrate deflection caused by gravity.

The linear evaporation source 300 stores an evaporated material and heats and injects the evaporated material onto the substrate S to form a layer of the evaporated material. The linear evaporation source 300 has a length extending in a first direction D1.

The vacuum deposition apparatus 100 may further include an evaporation source transfer unit 400 which serves to transfer the linear evaporation source 300 in the first direction D1.

The evaporation source transfer unit 400 includes a ball screw 410, a motor 430 rotating the ball screw 410, and a guide 420 for controlling the transfer direction of the linear evaporation source 300.

Figure 2:
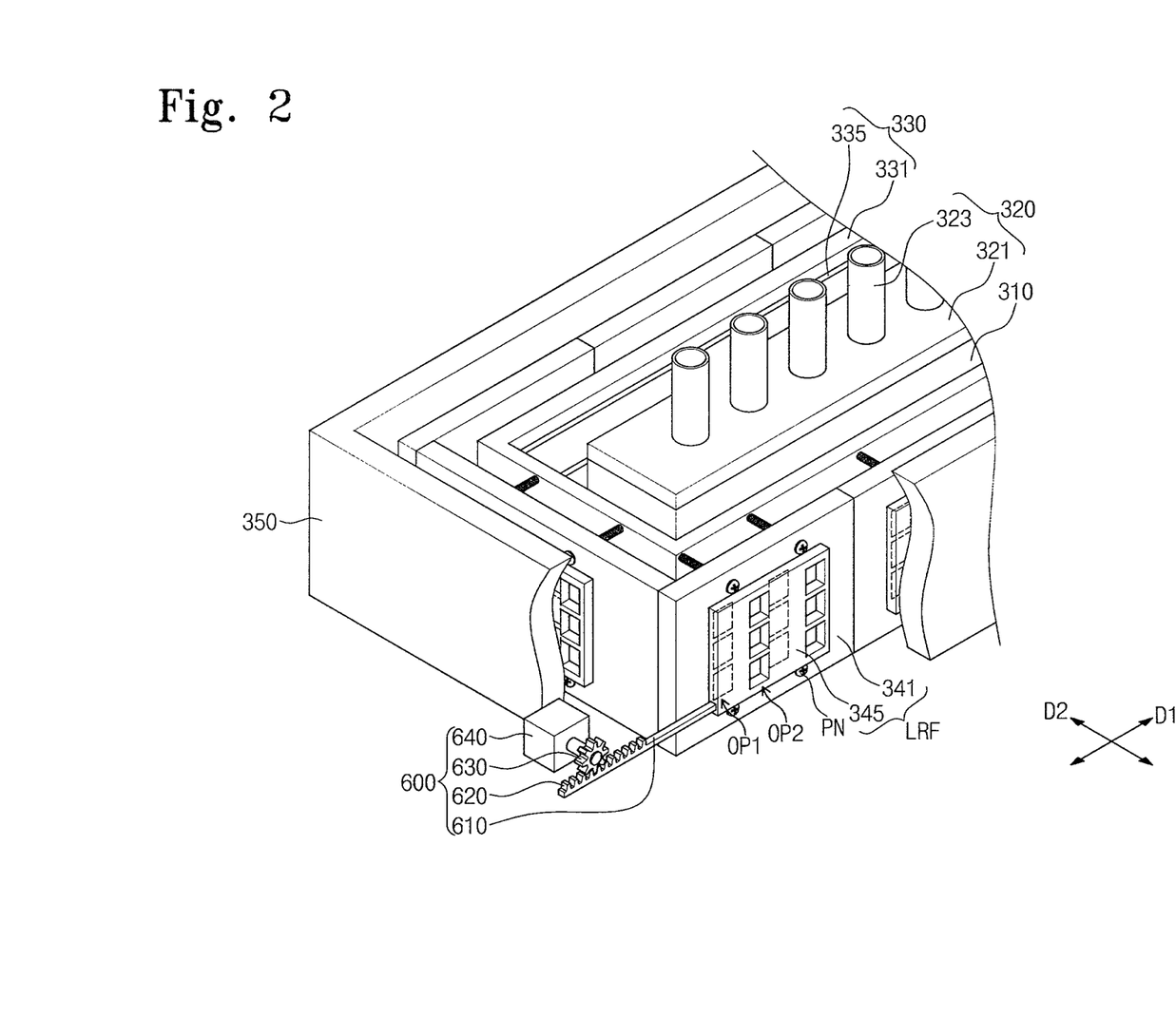
FIG. 2 is a perspective view of a linear evaporation source in FIG. 1.
Figure 3:
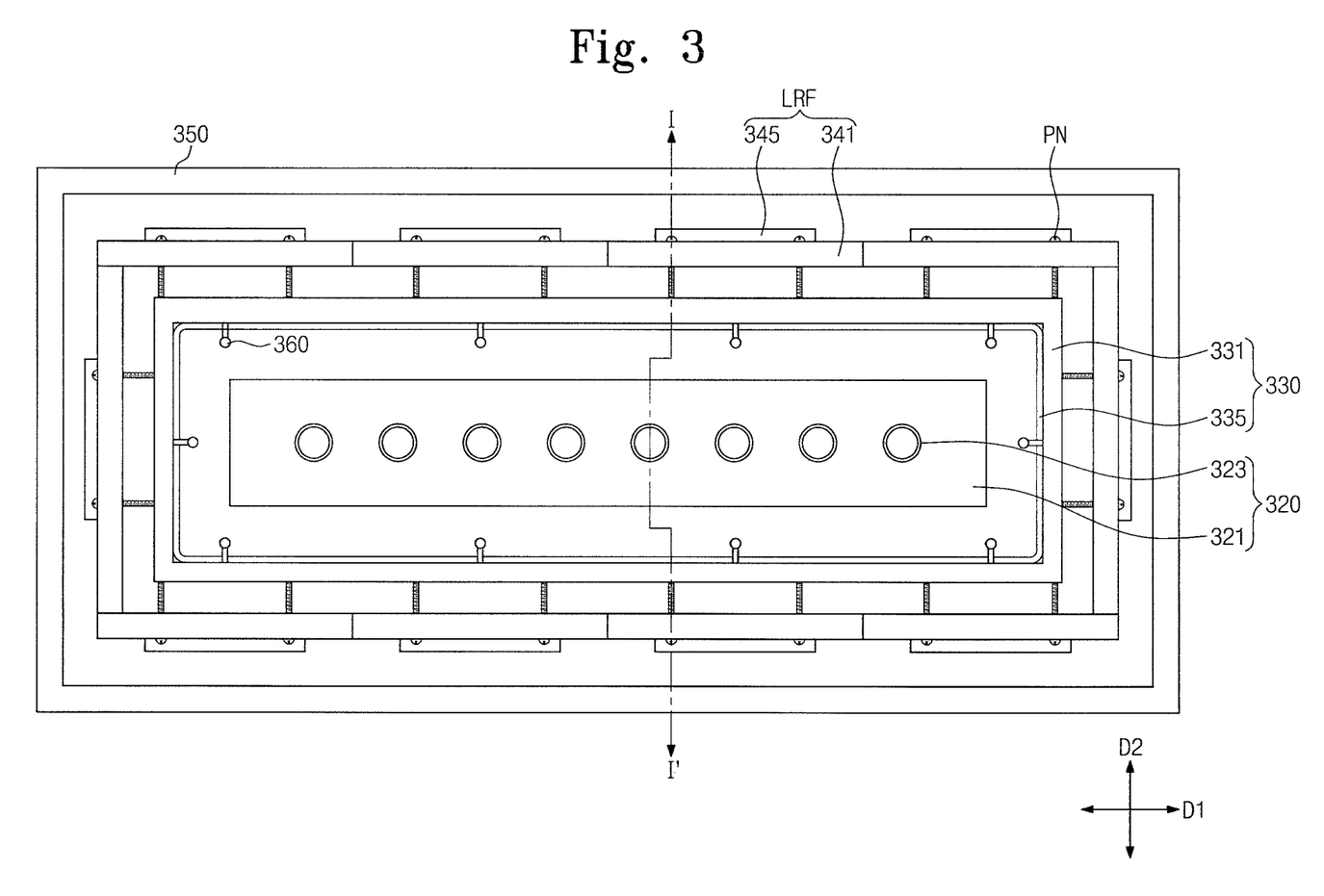
FIG. 3 is a top plan view of a linear evaporation source in FIG. 1.
Figure 4:
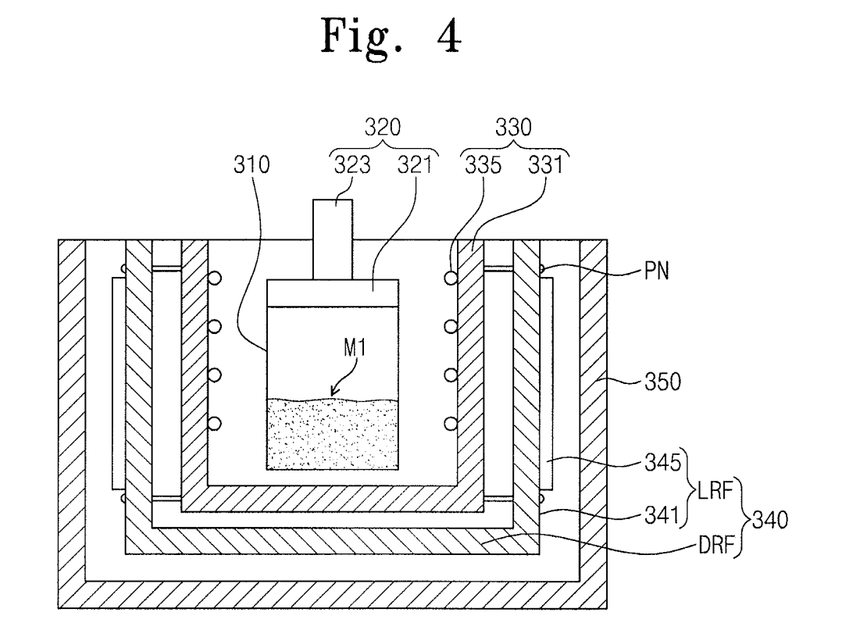
FIG. 4 is a cross-sectional view taken along the line I-I' in FIG. 3.

FIG. 2 is a perspective view of the linear evaporation source 300, and FIG. 3 is a top plan view of the linear evaporation source 300. FIG. 4 is a cross-sectional view taken along the line I-I' in FIG. 3.

Referring to FIGS. 2 to 4, the linear evaporation source 300 includes a crucible 310, a nozzle unit 320, a heater unit 330, a reflector 340, a cooling unit 350, and a temperature sensing unit 360.

The crucible 310 has an exposed top and stores an evaporated material M1. The crucible 310 has a length extending in the first direction D1.

The nozzle unit 320 includes a nozzle plate 321 disposed on the exposed top of the crucible 310 and a plurality of nozzles that extend upwardly toward the nozzle plate 321 through the nozzle plate 321. The nozzles 323 may be arranged in the first direction at substantially regular intervals. The evaporated material M1 inside the crucible 310 is deposited on a deposition target, i.e., substrate through the nozzles 323.

The heater unit 330 heats the crucible 310. The heater unit 330 includes a heater frame 331 and a heater 335 fixed to the heater frame 331.

The heater frame 331 is spaced apart from the crucible 310 and disposed to surround a lateral surface and a bottom surface, except for a top surface, of the crucible 310. The heater frame 331 is not limited in shape as long as it is capable of supporting the heater 335.

The heater 335 is provided on an inner surface of the heater frame 331 that faces the crucible 310. The heater 335 may be a heating coil and heat the lateral surface and the bottom surface of the crucible 310 to substantially uniformly control a temperature of the crucible 310.

The reflector 340 includes a down reflector DRF surrounding the bottom surface of the heater frame 331 and lateral reflectors LRF surrounding the lateral surface of the heater frame 331. The reflector 340 serves to block loss of heat generated by the heater unit 330.

The lateral reflectors LRF may be provided in plurality. In FIGS. 2 to 4, it is exemplarily shown that four lateral reflectors LRF are provided per lateral surface of the heater frame 331 in the first direction D1 and one lateral reflector LRF is provided per lateral surface of the heater frame 331 in a second direction D2.

Each of the lateral reflectors LRF may include a first reflector 341 and a second reflector 345.

The first reflector 341 is combined with the heater frame 331 while being spaced apart from the heater frame 331 by a predetermined distance. The first reflector 341 and the heater frame 331 may be combined with each other by a fixture pin PN. The first reflector 341 may be provided to have the shape of square plate, and the fixture pin PN may be provided at each of four corners of the square plate.

The first reflector 341 has a plurality of first openings OP1. The lateral surface of the heater frame 331 may be exposed by the first opening OP1.

The second reflector 345 faces the heater frame 331 with the first reflector 341 interposed therebetween. The second reflector 345 is movably combined with an outer lateral surface of the first reflector 341 in the first direction D1.

The second reflector 345 has a plurality of second openings OP2. The second opening OP2 may have the same size and number as the first opening OP1. An open ratio, which is an overlap ratio of the first opening OP1 and the second opening OP2, may be decided by the traveling of the second reflector 345. FIG. 2 shows an example in which the open ratio is zero percent because the first opening OP1 and the second opening OP2 do not overlap each other.

When viewed in the second direction D2, an area of the second reflector 345 may be smaller than that of the first reflector 341. However, the area of the second reflector 345 when viewed in the second direction D2 is not limited as long as mechanical interference between the second reflectors 345 can be avoided by the traveling of the second reflector 345 in the first direction D1.

Each of the lateral reflectors LRF may further include a transfer unit 600. The transfer unit 600 may include a transfer shaft 610, a rack 620, a pinion 630, a linear guide (not shown), and a motor 640.

The transfer shaft 610 extends in the first direction D1 while one end of the transfer shaft 610 is attached to the second reflector 345. FIG. 4 shows an example in which the transfer shaft 610 is coupled to one lateral surface of the second reflector 345.

The rack 620 is provided at the other end of the transfer shaft 610. The rack 620 is a sawtooth-cut version of the transfer shaft 610. The pinion 630 gears with the rack 620. The linear guide (not shown) is provided at an outer lateral surface of the first reflector 341 to guide a travel direction of the second reflector 345.

The motor 640 is rotatably combined with the pinion 630 to rotate the pinion 630. The transfer unit 600 allows the second reflector to travel in the first direction D1.

The open ratios of the lateral reflectors LRF may be independently controlled by the transfer unit 600. Thus, open ratios of one lateral reflector and an adjacent lateral reflector may be set to be different from each other.

The reflector 340 may be made of a material with a relatively low heat transfer rate and relatively low heat emissivity. The material may be, for example, Al, Au, Ag, Mn, Ti, $ZrO_2$, $Al_2O_3$, $TiO_2$, steel use stainless (SUS) or the like.

The cooling unit 350 is spaced apart from the reflector 340 and disposed to surround the reflector 340. The cooling unit 350 serves to prevent heat generated by the heater unit 330 from dissipating into the process chamber 200.

The temperature sensing unit 360 may be fixed to the heater frame 331 to be disposed between the crucible 310 and the heater 335.

The temperature sensing unit 360 may be provided in the same number as the lateral reflectors LRF. FIG. 3 shows an example in which ten temperature sensing units 360 are provided.

The temperature sensing unit 360 serves to measure area-depending temperatures of the crucible 310. The respective open ratios of the lateral reflectors LRF may be adjusted based on the measured area-depending temperatures of the crucible 310 to uniformly control the overall temperature of the crucible 310.

Figure 5A:
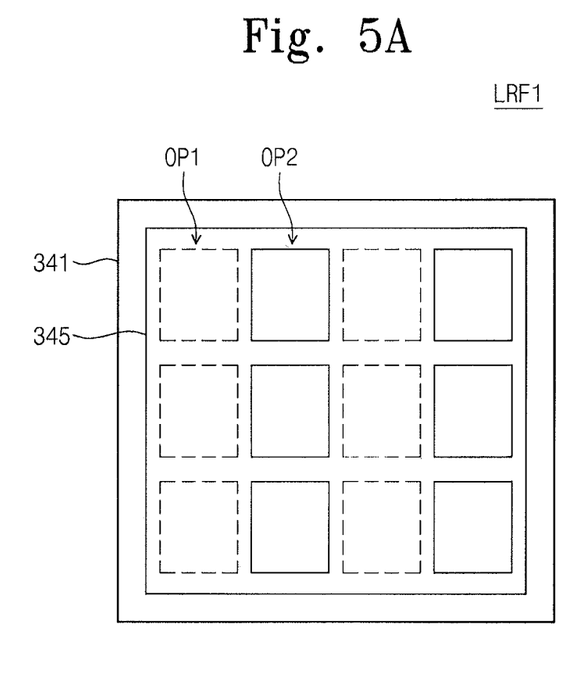
FIGS. 5A to 5C illustrate lateral reflectors having various open ratios, respectively.
Figure 5B:
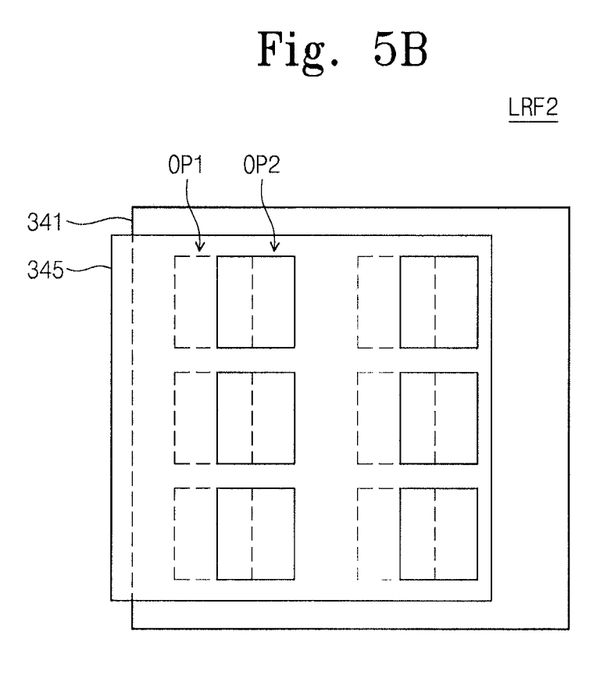
Figure 5C:
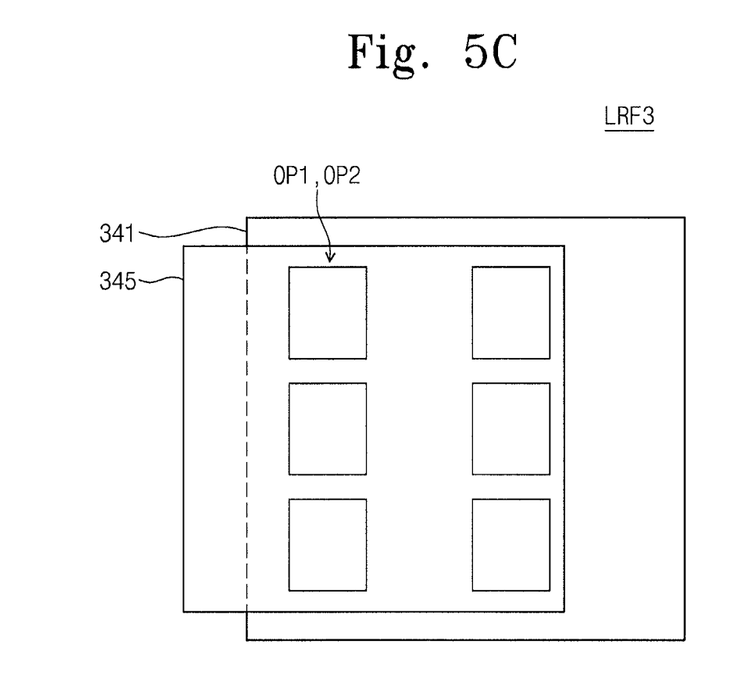

FIGS. 5A to 5C illustrate the reflectors having various open ratios, respectively. Referring to FIG. 5A, the first opening OP1 of the first reflector 341 is fully covered with the second reflector 345. In this case, the first opening OP1 and the second opening OP2 do not overlap each other. An open ratio of a lateral reflector LRF1 shown in FIG. 5A is zero percent.

Referring to FIG. 5B, the first opening OH of the first reflector 341 is partially covered with the second reflector 345. In this case, the first opening OP1 and the second opening OP2 overlap about half. An opening ratio of a lateral reflector LRF2 shown in FIG. 5B is about 50 percent.

Referring to FIG. 5C, the first opening OP1 of the first reflector 341 is not covered with the second reflector 345. In this case, the first opening OP1 and the second opening OP2 overlap substantially completely each other. An open ratio of a lateral reflector LRF3 shown in FIG. 5C is 100 percent.

Figure 6:
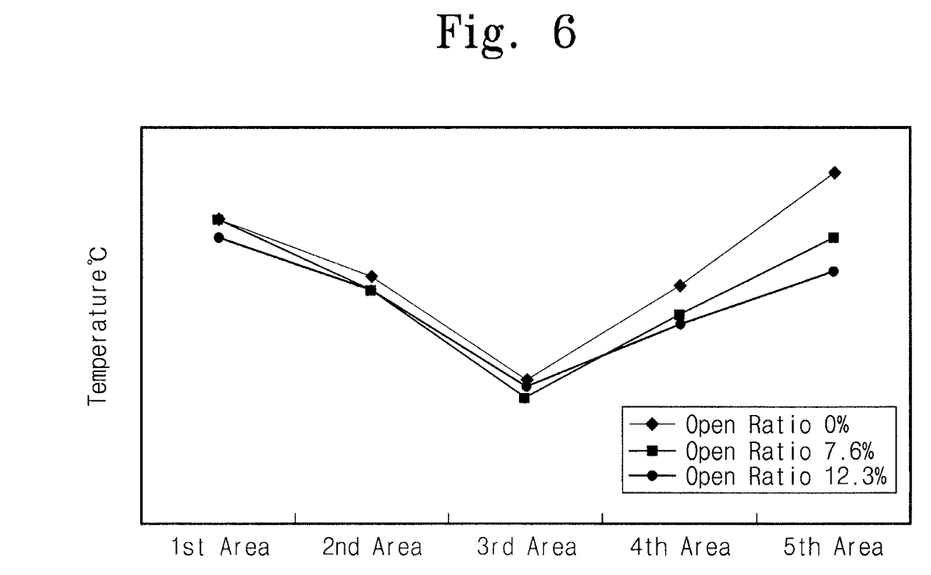
FIG. 6 illustrates a relationship between an open ratio of the lateral reflector and a temperature of a crucible.

FIG. 6 illustrates a relationship between an open ratio of the lateral reflector LRF and a temperature of a crucible.

Measurement conditions will now be described. The crucible was divided into five areas, i.e., first to fifth regions. Lateral reflectors were provided at the first to fifth areas, respectively. A temperature of the crucible was measured while open ratios of the lateral reflectors provided at the first to fifth areas were maintained at the same value and the open ratio of the lateral reflector provided at the fifth area changed to about zero percent, about 7.6 percent, and about 12.3 percent.

Referring to FIG. 6, it will be understood that the greater an open ratio of a lateral reflector, the lower the temperature of the crucible.

As described so far, a temperature of a crucible can be controlled according to areas of the crucible by adjusting an opening ratio of a lateral reflector. Thus, deposition uniformity of a linear evaporation source can be enhanced.

While the inventive concept has been particularly shown and described with reference to embodiments thereof, it will be apparent to those of ordinary skill in the art that various changes in form and detail may be made therein without departing from the spirit and scope of the inventive concept as defined by the following claims.

What is claimed is:

1. A linear evaporation source comprising:
   a single crucible storing an evaporation material, wherein the crucible includes a plurality of side surfaces, and top and bottom surfaces opposing each other, wherein the single crucible is connected to a plurality of nozzles;
   a heater unit surrounding the crucible and configured to heat the crucible;
   a down reflector surrounding the bottom surface of the crucible;
   a plurality of lateral reflectors surrounding a lateral surface of the heater unit; and
   a plurality of temperature sensing units disposed between the crucible and the heater unit,
   wherein each of the lateral reflectors comprises:
   a first reflector combined with the heater unit and spaced apart from the heater unit, wherein a first opening is formed in the first reflector; and
   a second reflector movably combined with the first reflector, wherein a second opening is formed in the second reflector,
   wherein each of the lateral reflectors further comprises a transfer unit configured to linearly move the second reflector with respect to the first reflector from a first position where the first and second openings do not overlap each other to a second position where the first and second openings at least partially overlap each other,
   wherein the heater unit comprises:
   a heater configured to heat the crucible; and
   a heater frame configured to support the heater, wherein the heater frame has first and second surfaces opposing each other, wherein the first surface of the heater frame faces the first reflector, wherein the second surface of the heater frame faces the crucible, wherein the heater is positioned between the second surface of the heater frame and the crucible and is disposed directly on the second surface of the heater frame,
   wherein each of the plurality of temperature sensing units is disposed on the second surface of the heater frame in a one-to-one correspondence with each of the lateral reflectors to measure area-depending temperatures of the crucible,
   wherein the transfer unit of each of the lateral reflectors is further configured to independently move a corresponding one of the plurality of lateral reflectors based on the corresponding area-depending temperature of the crucible such that open ratios of the lateral reflectors are independently adjusted, and
   the first opening of the first reflector has one or more openings located at a top half of the first reflector along a height direction of the heater unit, and the first opening of the first reflector has one or more openings located at a bottom half of the first reflector along the height direction of the heater unit.

2. The linear evaporation source as set forth in claim 1, wherein the transfer unit comprises:
   a transfer shaft having one end attached to the second reflector;
   a rack provided at the other end of the transfer shaft;
   a pinion engaged with the rack;
   a motor rotatably combined with the pinion to rotate the pinion; and
   a linear guide provided at an outer lateral surface of the first reflector to guide a traveling direction of the second reflector.

3. The linear evaporation source as set forth in claim 1, wherein the first opening and the second opening have substantially the same size and number.

4. The linear evaporation source as set forth in claim 1, wherein the first reflector and the heater frame are combined by a fixture pin.

5. The linear evaporation source as set forth in claim 1, further comprising a cooling unit spaced apart from the lateral reflectors and disposed to surround the lateral reflectors.

6. The linear evaporation source as set forth in claim 1, wherein the heater frame continuously surrounds the side surfaces and the bottom surface of the crucible, and the heater is formed on sides of the heater unit and surrounds only the side surfaces of the crucible.

7. The linear evaporation source as set forth in claim 1, wherein the heater frame is between the plurality of temperature sensing units and the plurality of lateral reflectors.

8. The linear evaporation source as set forth in claim 1, wherein an opening ratio on the top half is the same as an opening ratio on the bottom half of the first reflector.

9. A vacuum deposition apparatus comprising:
   a process chamber;
   a linear evaporation source housed in the process chamber; and
   a substrate holder disposed opposite to the linear evaporation source,
   wherein the linear evaporation source comprises:
   a single crucible storing an evaporation material, wherein the crucible includes a plurality of side surfaces, and top and bottom surfaces opposing each other, wherein the single crucible is connected to a plurality of nozzles;
a heater unit surrounding the crucible and configured to heat the crucible;
a down reflector surrounding the bottom surface of the crucible;
a plurality of lateral reflectors surrounding a lateral surface of the heater unit; and
a plurality of temperature sensing units disposed between the crucible and the heater unit,
wherein each of the lateral reflectors comprises:
a first reflector combined with the heater unit and spaced apart from the heater unit, wherein a first opening is formed in the first reflector; and
a second reflector movably combined with the first reflector, wherein a second opening is formed in the second reflector,
wherein each of the lateral reflectors further comprises a transfer unit configured to linearly move the second reflector with respect to the first reflector from a first position where the first and second openings do not overlap each other to a second position where the first and second openings at least partially overlap each other,
wherein the heater unit comprises:
a heater configured to heat the crucible; and
a heater frame configured to support the heater, wherein the heater frame has first and second surfaces opposing each other, wherein the first surface of the heater frame faces the first reflector, wherein the second surface of the heater frame faces the crucible, wherein the heater is positioned between the second surface of the heater frame and the crucible and is disposed directly on the second surface of the heater frame,
wherein each of the plurality of temperature sensing units is disposed on the second surface of the heater frame in a one-to-one correspondence with each of the lateral reflectors to measure area-depending temperatures of the crucible,
wherein the transfer unit of each of the lateral reflectors is further configured to independently move a corresponding one of the plurality of lateral reflectors based on the corresponding area-depending temperature of the crucible such that open ratios of the lateral reflectors are independently adjusted, and
the first opening of the first reflector has one or more openings located at a top half of the first reflector along a height direction of the heater unit, and at a bottom half of the first reflector along the height direction of the heater unit.

10. The vacuum deposition apparatus as set forth in claim 9, wherein the first opening and the second opening have substantially the same size and number.

11. The vacuum deposition apparatus as set forth in claim 9, wherein the first reflector and the heater frame are combined by a fixture pin.

12. A linear evaporation source comprising:
a single crucible storing an evaporation material, wherein the single crucible is connected to a plurality of nozzles;
a heater unit surrounding the crucible and configured to heat the crucible;
a down reflector surrounding a bottom surface of the crucible;
a plurality of lateral reflectors surrounding a lateral surface of the heater unit; and
a plurality of temperature sensing units disposed between the crucible and the heater unit,
wherein each of the lateral reflectors comprises:
a first reflector combined with the heater unit and spaced apart from the heater unit, wherein a first opening is formed in the first reflector; and
a second reflector movably combined with the first reflector, wherein a second opening is formed in the second reflector,
wherein each of the lateral reflectors further comprises a transfer unit configured to linearly move the second reflector with respect to the first reflector from a first position where the first and second openings do not overlap each other to a second position where the first and second openings at least partially overlap each other,
wherein the heater unit comprises:
a heater configured to heat the crucible; and
a heater frame configured to support the heater, wherein the heater frame has first and second surfaces opposing each other, wherein the first surface of the heater frame faces the first reflector, wherein the second surface of the heater frame faces the crucible, wherein the heater is positioned between the second surface of the heater frame and the crucible and is disposed directly on the second surface of the heater frame,
wherein each of the plurality of temperature sensing units is disposed on the second surface of the heater frame in a one-to-one correspondence with each of the lateral reflectors to measure area-depending temperatures of the crucible,
wherein the transfer unit of each of the lateral reflectors is further configured to independently move a corresponding one of the plurality of lateral reflectors based on the corresponding area-depending temperature of the crucible such that open ratios of the lateral reflectors are independently adjusted, and
the first opening of the first reflector has one or more openings located at a top half of the first reflector along a height direction of the heater unit, and at a bottom half of the first reflector along the height direction of the heater unit.

* * * * *